US007071064B2

(12) United States Patent
Doyle et al.

(10) Patent No.: US 7,071,064 B2
(45) Date of Patent: Jul. 4, 2006

(54) U-GATE TRANSISTORS AND METHODS OF FABRICATION

(75) Inventors: Brian Doyle, Portland, OR (US); Surinder Singh, Beaverton, OR (US); Uday Shah, Portland, OR (US); Justin Brask, Portland, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/949,994

(22) Filed: Sep. 23, 2004

(65) Prior Publication Data

US 2006/0063332 A1    Mar. 23, 2006

(51) Int. Cl.
*H01L 21/336* (2006.01)
*H01L 29/76* (2006.01)
(52) U.S. Cl. .................... 438/283; 438/284; 257/365; 257/401; 257/623
(58) Field of Classification Search ............... 438/279, 438/283, 284; 257/347, 365, 401, 623
See application file for complete search history.

(56) References Cited

U.S. PATENT DOCUMENTS

| 6,475,890 | B1 * | 11/2002 | Yu | 438/574 |
| 6,562,665 | B1 | 5/2003 | Yu | |
| 2005/0035391 | A1 * | 2/2005 | Lee et al. | 257/308 |
| 2005/0104096 | A1 * | 5/2005 | Lee et al. | 257/288 |

* cited by examiner

*Primary Examiner*—Trung Dang
(74) *Attorney, Agent, or Firm*—Blakely, Sokoloff, Taylor & Zafman LLP

(57) ABSTRACT

A process is described for manufacturing of non-planar multi-corner transistor structures. A fin of a semiconductor material having a mask on a top surface of the fin is formed on a first insulating layer. A second insulating layer is formed on the fin exposing a top surface of the mask, wherein a protection layer is deposited between the fin and the second insulating layer. Next, the mask is removed and spacers are formed on the fin adjacent to the protection layer. A recess having a bottom and opposing sidewalls is formed in the fin. A gate dielectric layer and a gate electrode are formed on the top surface, the opposing sidewalls of the fin and on the bottom and on the opposing sidewalls of the recess in the fin. A source region and a drain region are formed in the fin at the opposite sides of the gate electrode.

37 Claims, 16 Drawing Sheets

U-GATE TRANSISTORS AND METHODS OF FABRICATION

FIELD

Embodiments of the invention relate generally to the field of semiconductor manufacturing, and more specifically, to a semiconductor transistor structure and methods of its manufacturing.

BACKGROUND

Integrated circuits include millions of metal oxide semiconductor field effect transistors ("MOSFET"). Such transistors may include p-channel MOS transistors, and n-channel MOS transistors, depending on their dopant conductivity type. The steady downscaling of MOS transistor dimensions has been the main stimulus to the growth of microelectronics and the computer industry over the past two decades. The major limiting factors for MOSFET scaling are the short-channel effects, for example, threshold voltage roll-off at decreasing channel length and Drain Induced Barrier Lowering ("DIBL"). Short-channel effects due to the decreased length of the transistor channel between source and drain regions can severely degrade the performance of the semiconductor transistor. Because of short-channel effects, the electrical characteristics of the transistor, for example, threshold voltage, subthreshold currents, and current-voltage characteristics beyond threshold become difficult to control with bias on the gate electrode.

FIG. 1 illustrates a cross-sectional view of a conventional prior art planar MOSFET structure 100. The silicon layer 102 is epitaxially grown on a monocrystalline silicon substrate 101. Field isolation regions 103 to isolate adjacent integrated circuit devices are formed in the silicon layer 102. Gate dielectric 104 and gate electrode 105 are subsequently deposited on the silicon layer 102. Ions are implanted into the layer of silicon forming source extension region 106 and drain extension region 107 on opposing sides of the gate electrode 105. The source extension 106 and the drain extension 107 are shallow junctions to minimize short-channel effects in the MOSFET structure 100 having sub-micron or nanometer dimensions. Spacers 108 are deposited on the opposing sides of the gate electrode 105 and the gate dielectric 104. The spacers 108 cover sides of the gate electrode 105 and the gate dielectric 104, and also cover portions of the top surface of the silicon layer 102 adjacent and on opposing sides of the gate electrode 105. If spacers 108 include silicon nitride ("$Si_3N_4$"), spacer liner oxide 109 is deposited as a buffer layer between the spacers 108 and the opposing sides of the gate electrode 105 and the gate dielectric 104. A source contact junction 110 with a source contact 111 and a drain contact junction 112 with a drain contact 113 are formed in the silicon layer 102 at the opposing sides of the gate electrode 105. The source contact junction 110 and the drain contact junction 112 are fabricated as deep junctions such that a relatively large size of the source contact 111 and the drain contact 113 respectively may be fabricated therein to provide low resistance contact to the drain and the source respectively of the MOSFET structure 100. For polysilicon gate electrode, a gate silicide 114 is formed on the gate electrode 105 to provide contact to the gate of the MOSFET structure 100.

FIG. 2 is a perspective view of a Tri-gate transistor structure 200, which provides improved control over the electrical characteristics of the transistor. The Tri-gate transistor structure 200 has a source region 201 and a drain region 202 formed in the fin body 203 at opposite sides of the gate electrode 204. The fin body 203 is formed on a top surface of the insulating layer 206 on a silicon substrate 207. The gate electrode 204 with underlying gate dielectric 205 covers a top 208 and two opposing sidewalls 209 of a portion of the fin body 203. The Tri-gate transistor structure 200 provides conductive channels along the top 208 and the two opposing sidewalls 209 of the portion of the fin body 203. This effectively triples the space available for electrical signals to travel that gives the Tri-gate transistor substantially higher performance than the conventional planar transistors without using more power. The corners 211 of the gate electrode 204 having gates on two adjacent sides of the fin body 203 increase control over the electrical characteristics of the transistor. At low gate voltages the performance of corner portion of the Tri-gate transistor dominates in the current-voltage ("Id-Vg") characteristics. Above threshold voltage, however, the non-corner portion of the Tri-gate body turns on and dominates in the operation of the transistor. The non-corner portions of the Tri-gate body, however, has substantially less control over the short-channel effects than the corner portions of the Tri-gate body that degrades performance of the Tri-gate transistor.

BRIEF DESCRIPTION OF THE DRAWINGS

The present invention is illustrated by way of example and not limitation in the figures of the accompanying drawings, in which like references indicate similar elements, in which.

DETAILED DESCRIPTION

In the following description, numerous specific details, such as specific materials, dopant concentrations, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "for one embodiment" or "for an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Figure 4:
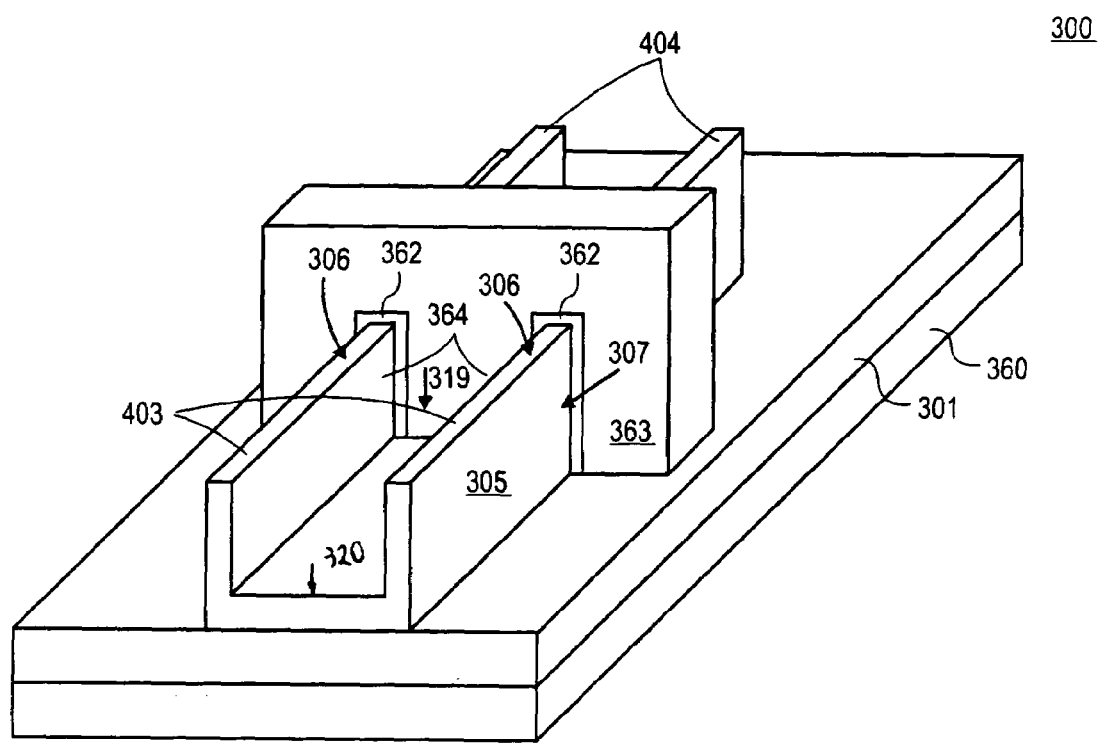
FIG. 4 is a perspective view of a U-gate semiconductor transistor structure according to one embodiment of the invention.

Non-planar semiconductor transistor structures with improved short-channel performance and methods of their reliable fabrication are described herein. FIG. 4 is a perspective view of a non-planar U-gate semiconductor transistor structure 300 with increased proportion of the corner portion over the non-corner portion according to one embodiment of the invention. As shown in FIG. 4, a gate dielectric layer 362 and a gate electrode 363 are formed on a portion of a fin 305 on an insulating layer 301 on a substrate 360, and a source region 403 and a drain region 404 are formed at opposite sides of the fin 305. As shown in FIG. 4, the gate electrode 363 with the gate dielectric layer 362 covers a top surface 306 and two opposing sidewalls 307 of the portion of the fin 305, and a bottom 320 and two opposing sidewalls 364 of a portion of a recess 319 in the fin 305 effectively increasing the space available for electrical signals to travel. The prevailing corner portion of the transistor structure provides improved short-channel control over the electrical characteristics of the device. The current-voltage characteristics are dominated by the performance of the corner portion of the device over the full gate voltage range, such that the short-channel effects are minimized and sub-threshold and drive currents are optimized. The non-planar U-gate semiconductor transistor structure 300 is fabricated by forming a fin of a semiconductor material with a mask layer on a top of the fin on a first insulating layer. A buffer layer is formed between the top surface of the fin and the mask layer. Next, a protection layer is formed on the mask layer, wherein the protection layer covers the top surface of the mask layer, two opposing sidewalls of the mask, two opposing sidewalls of the fin and portions of the first insulating layer at opposing sides of the fin. Subsequently, a second insulating layer is formed on the protection layer. Next, the second insulating layer is planarized to expose the top surface of the mask layer such that the top surface of the second insulating layer covering the protection layer on the portions of the first insulating layer at opposing sides of the fin is substantially planar with the top surface of the mask layer. Further, the mask layer is removed to expose the top surface of the fin covered by the buffer layer. Subsequently, spacers are formed on the buffer layer adjacent to the protection layer. Next, a recess is formed in the fin, wherein the recess has a bottom and two opposing sidewalls vertical to the bottom. Further, a gate dielectric layer is formed on the top surface and two opposing sidewalls of the fin and bottom and the opposing sidewalls of the recess in the fin. Subsequently, a gate electrode is formed on the gate dielectric layer. Next, a source region and a drain region are formed on the opposite sides of the gate electrode. For one embodiment, at least one step is formed in each of the two opposing sidewalls of the recess. The process reliably provides a non-planar semiconductor transistor structure having U-shape with vertically defined set of corners. Effectively, the number of corners under the full gate control in this transistor structure is at least doubled relative to the standard Tri-gate transistor, substantially reducing the contribution of the non-corner portion into the transistor performance. Gate electrode formed on both interior and exterior sides of each of the opposing sidewalls as well as on the bottom of the recess in the fin provides full depletion of a channel of the U-gate transistor structure. In addition, because gates on each of the two opposing sidewalls of the U-shaped transistor structure are substantially closer to each other than two opposing side gates of a single fin of the Tri-gate transistor, non-corner characteristics of the U-shaped transistor structure are also maximized. Further, the area available for electrical signals to travel in the U-shaped transistor structure substantially increases relative to the Tri-gate transistor structure. As a result, multi-corner U-shaped transistor structure improves the overall performance of the transistor by at least 10%. A DIBL parameter of the U-shaped transistor structure, for example, is substantially smaller than a DIBL parameter of the Tri-gate transistor structure at any gate length, approaching a theoretical limit of 0 mV/V.

Figure 1:
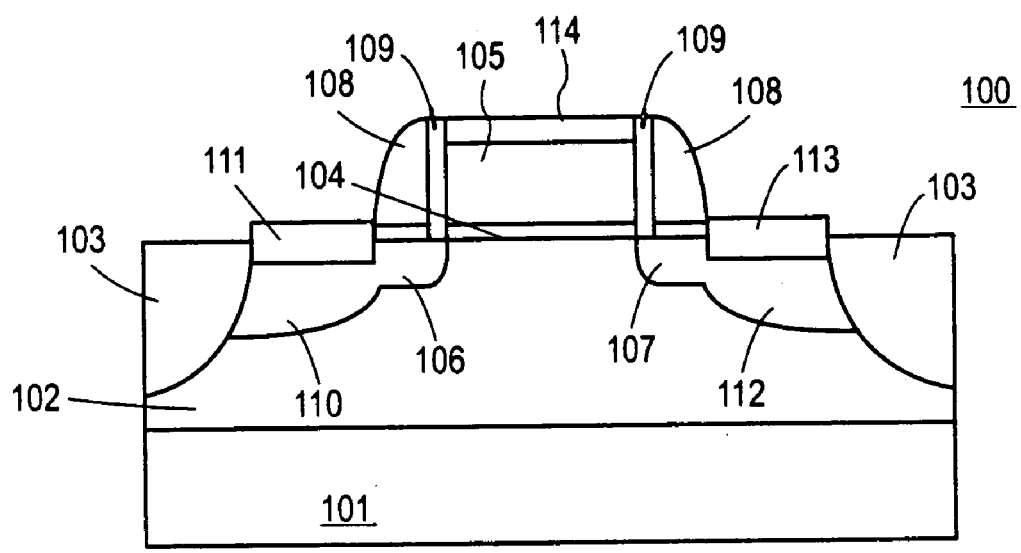
FIG. 1 illustrates a cross-sectional view of a conventional prior art planar MOSFET structure.
Figure 2:
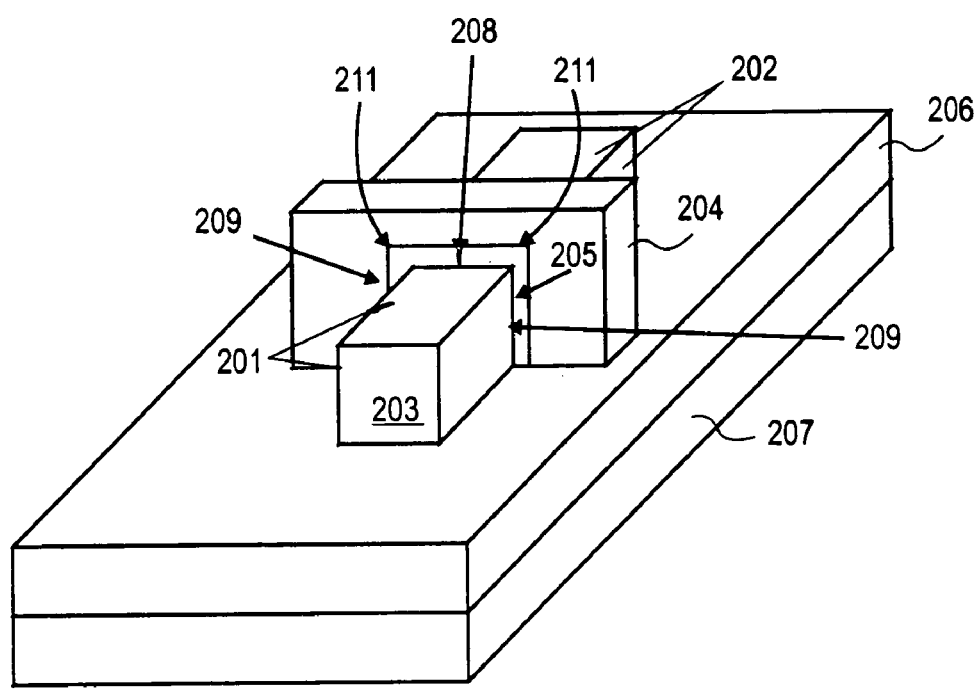
FIG. 2 is a perspective view of a prior art Tri-gate transistor structure.
Figure 3A:
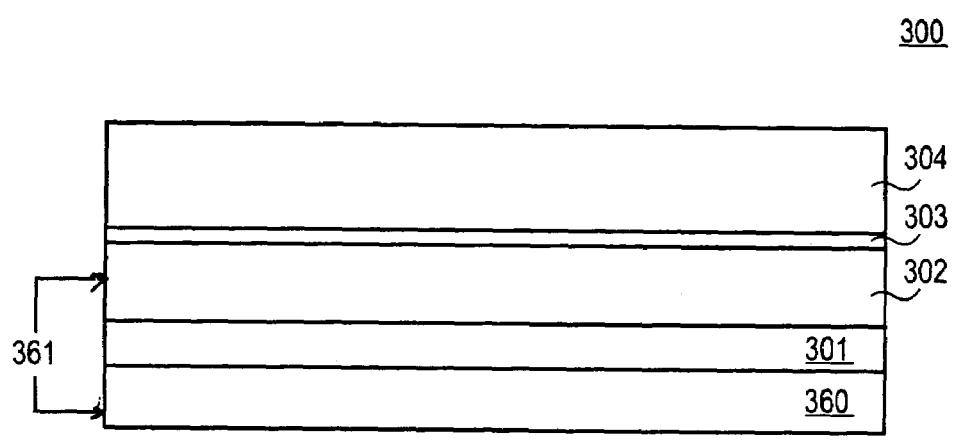
FIG. 3A illustrates a cross-sectional view of a semiconductor structure to fabricate an U-gate transistor according to one embodiment of the invention.

FIG. 3A illustrates a cross-sectional view of a semiconductor structure 300 to fabricate an U-gate transistor according to one embodiment of the invention. As shown in FIG. 3A, the semiconductor structure 300 includes a layer 302 of a semiconductor material formed on an insulating layer 301 on a substrate 360. For one embodiment, the layer 302 of the semiconductor material is formed on the insulating layer 301 covering a substrate 360 of monocrystalline silicon, as shown in FIG. 3A. For one embodiment, the layer 302 deposited on the insulating layer 301 is monocrystalline silicon ("Si"), wherein the insulating layer 301 on the substrate 360 of silicon is a buried oxide. More specifically, the insulating layer 301 includes silicon dioxide. In alternative embodiments, the insulating layer 301 may be any one, or a combination of, sapphire, silicon dioxide, silicon nitride, or other insulating materials. As shown in FIG. 3A, the insulating layer 301 sandwiched between layer 302 of the monocrystalline silicon and the substrate 360 of silicon forms a silicon-on-isolator (SOI) substrate 361. The SOI substrate may be fabricated by any one of the techniques known in the art, for example, separation by implantation of oxygen (SIMOX), hydrogen implantation and separation approach (also called SmartCut®), and the like. For an embodiment, the thickness of the layer 302 of the monocrystalline silicon formed on the insulating layer 301 of the buried oxide is in the approximate range of 20 nm to 200 nm. More specifically, the thickness of the layer 302 on the insulating layer 301 is between 30 mm to 150 nm. For alternate embodiments, the substrate 360 may include III–V and other semiconductors, for example, indium phosphate, gallium arsenide, gallium nitride, and silicon carbide.

Next, a mask layer 304 is formed on or above the layer 302. For one embodiment, a buffer layer 303 is formed between the layer 302 and the mask layer 304 to smooth the transition between the layer 302 and the mask layer 304. For an embodiment, the mask layer 304 formed on the layer 302 of monocrystalline silicon on the insulating layer 301 is a hard mask layer. In one embodiment, the buffer layer 303 of silicon dioxide ("SiO2") is formed between the layer 302 of a monocrystalline silicon and a mask layer 304 of silicon nitride ("$Si_3N_4$"). For an embodiment, the thickness of the buffer layer 303 sandwiched between the mask layer 304 and the layer 302 is in the approximate range of 10 Å to 150 Å. More specifically, the thickness of the buffer layer 303 is about 30 Å. For one embodiment, the thickness of the mask layer 304 on the layer 302 is in the approximate range of 20 nanometers ("nm") to 200 mm. More specifically, the thickness of the mask layer 304 of silicon nitride on the layer 302 of monocrystalline silicon is about 150 nm. The mask layer 304 and the buffer layer 303 may be deposited on the layer 302 using a technique known to one of ordinary skill in the art of semiconductor fabrication, such as Chemical Vapour Deposition ("CVD") technique.

Figure 3B:
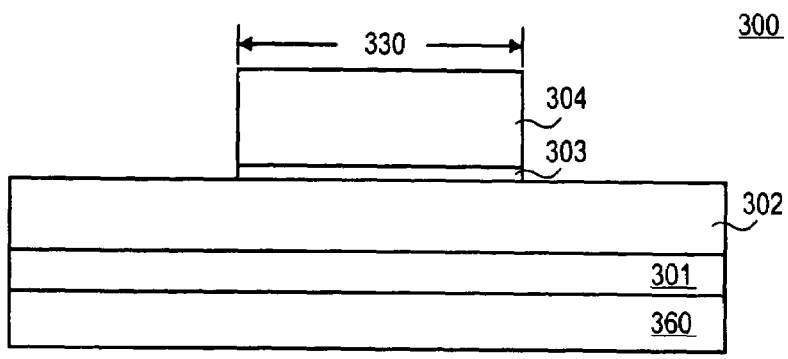
FIG. 3B is a view similar to FIG. 3A, after patterning and etching the mask layer and the buffer layer deposited on the layer of the semiconductor material.

FIG. 3B shows the mask layer 304 and the buffer layer 303 deposited on the layer 302 after patterning and subsequently etching to a predetermined width 330 and length (not shown) to form a fin from the layer 302 on the insulating layer 301 on the substrate 360. Patterning and etching of the mask layer 304 and the buffer layer 303 deposited on the layer 302 may be performed by techniques known to one of ordinary skill in the art of semiconductor fabrication.

Figure 3C:
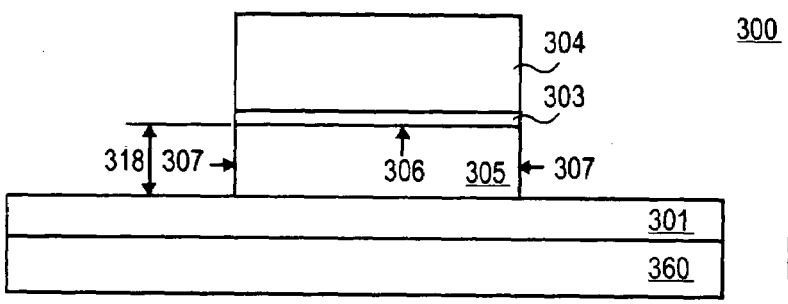
FIG. 3C is a view similar to FIG. 3D after forming a fin of a semiconductor material on the insulating layer.

Next, the layer 302 is patterned and subsequently etched to form a fin on the insulating layer 301. FIG. 3C shows a cross-sectional view of the semiconductor structure 300 after forming the fin 305 from the layer 302 on the insulating layer 301. As illustrated in FIG. 3C, the fin 305 having a width 330, a length (not shown), and a height 318, includes a top surface 306 and two opposing sidewalls 307. For an embodiment, the buffer layer 303 is deposited between the top surface 306 of the fin 305 and the mask layer 304. For one embodiment, the width 330 of the fin 305 may be in the approximate range of 20 nm to 120 nm and the height 318 of the fin 305 may be in the approximate range of 20 to 150 nm. For an embodiment, the fin 305 from the layer 302 is patterned and etched to a size defined by a smallest feature of a photolithography technique. For an embodiment, the layer 302 of monocrystalline silicon on the insulating layer 301 of a buried oxide may be patterned and etched using techniques known to one of ordinary skill in the art of semiconductor fabrication.

Figure 3D:
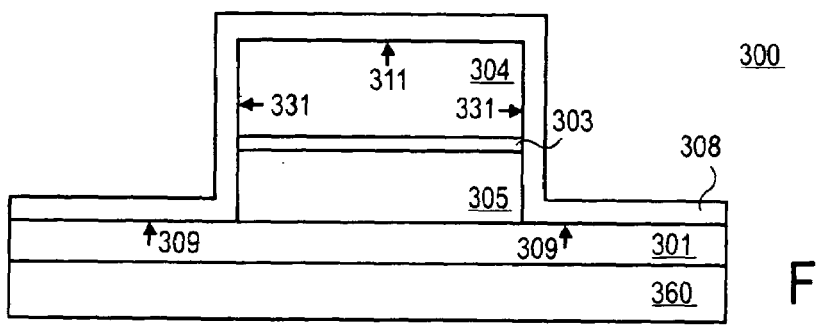
FIG. 3D is a view similar to FIG. 3C, after forming a protection layer on the fin.

FIG. 3D shows a cross-sectional view of the semiconductor structure 300 after forming a protection layer 308 on the fin 305. As shown in FIG. 3D, the protection layer 308 covers two opposing sidewalls 307 of the fin 305, a top 311 and two opposing sidewalls 331 of the mask layer 304, and portions 309 of the insulating layer 301 on opposite sides of the fin 305. For an embodiment, the protection layer 308 is formed on the fin 305 to protect the opposing sidewalls 307 and the portions 309 from undercutting during subsequent etching. For one embodiment, the protection layer 308 has substantially slow etching rate relative to the etching rate of the mask layer 304 to provide, later on in the process, selective etching of the mask layer 304 leaving the protection layer 308 intact. More specifically, the etching rate of the protection layer 308 is about 10 times slower than the etching rate of the mask layer 304. For one embodiment, the protection layer 308 covering the fin 305 of monocrystalline silicon and the mask layer 304 of $Si_3N_4$ includes carbon doped silicon nitride ("$Si_3N_4$: C"). More specifically, the content of carbon in silicon nitride is about 3 to 5 atomic percent. More specifically, the etching rate with hot phosphoric acid of the mask layer 304 of $Si_3N_4$ is about 50 Å/min, while the etching rate of the protection layer 308 of $Si_3N_4$: C covering the mask layer 304 is about 5 Å/min to selectively etch away the mask layer 304 of $Si_3N_4$ while preserving the protection layer 308 of $Si_3N_4$: C later on in the process. For one embodiment, the thickness of the protection layer 308 of $Si_3N_4$: C deposited on the fin 305 of monocrystalline silicon and the mask layer 304 of $Si_3N_4$ is between 20 Å to 100 Å. The protection layer 308 may be deposited on the fin 305 using techniques known to one of ordinary skill in the art of semiconductor fabrication.

Figure 3E:
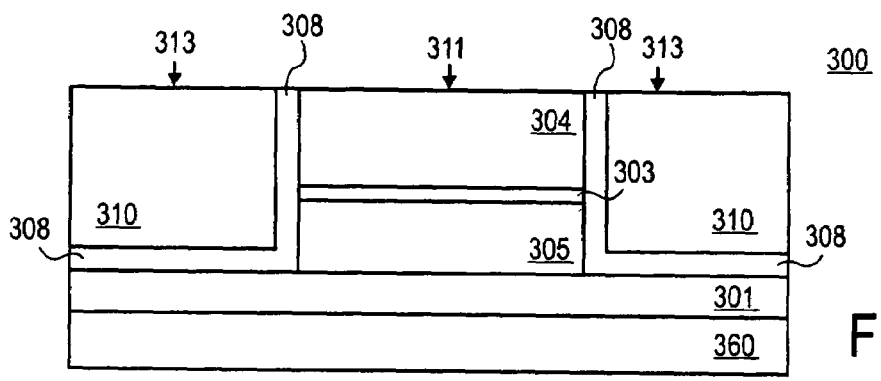
FIG. 3E is a view similar to FIG. 3D, after forming a second insulating layer on the protection layer.

FIG. 3E shows a cross-sectional view of the semiconductor structure 300 after forming an insulating layer 310 on the protection layer 308. As shown in FIG. 3E, the insulating layer 310 covers the protection layer 308 revealing the top surface 311 of the mask layer 304. For one embodiment, the insulating layer 310 on the protection layer of $Si_3N_4$: C, which covers the fin 305 of monocrystalline silicon and the mask layer 304 of $Si_3N_4$, is silicon dioxide ("$SiO_2$"). The insulating layer 310 can be formed by blanket deposition on the protection layer and then polished back by, for example, chemical-mechanical polishing ("CMP"), to remove the insulating layer 310 and a portion of the protection layer 308 from the top surface 311 of the mask layer such that the top surface 311 of the mask layer 304 is substantially planar with the top surface 313 of the insulating layer 310, as shown in FIG. 3E. Depositing the insulating layer of silicon dioxide on the protection layer of $Si_3N_4$:C may be performed using techniques known to one of ordinary skill in the art of semiconductor fabrication.

Figure 3F:
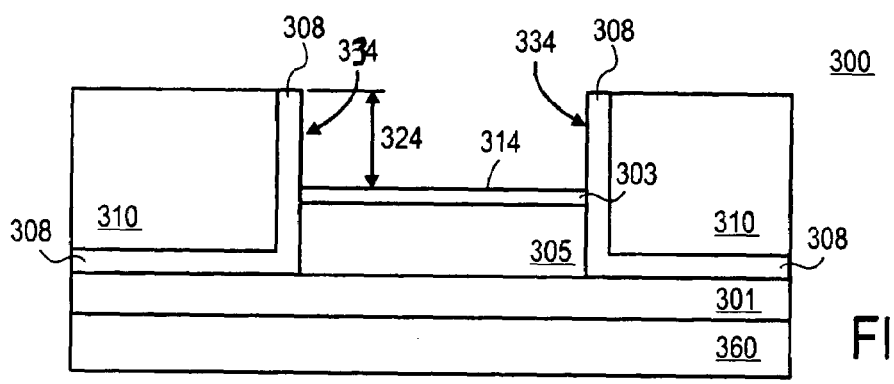
FIG. 3F is a view similar to FIG. 3E, after removing the mask layer.

FIG. 3F is a cross-sectional view of the semiconductor structure 300 after removing the mask layer 304. As shown in FIG. 3F, the mask layer 304 is selectively removed from the top surface 314 of the buffer layer 303 leaving the insulating layer 310 and the protection layer 308 at opposing sides of the fin 305 intact. The height 324 of the exposed portions 334 of the protection layer 308 defined by the thickness of the mask layer 304 is therefore preserved ensuring a predetermined depth of a recess formed in the fin 305 later on in the process. For one embodiment, the mask layer 304 may be removed from the buffer layer 303 by wet etching with the chemistry having substantially high selectivity to the protection layer 308 and the insulating layer 310, meaning that the chemistry predominantly etches the mask layer 304 rather than the protection layer 308 and the insulating layer 310. For one embodiment, the ratio of the etching rates of the mask layer 304 to the protection layer 308 and the insulating layer 310 is about 10:1. For one embodiment, the mask layer 304 of $Si_3N_4$ may be selectively etched away from the top surface 314 of the buffer layer 303 of $SiO_2$, while preserving the protection layer 308 of $Si_3N_4$: C and the insulating layer 310 of $SiO_2$, by wet etching with hot phosphoric acid.

Figure 3G:
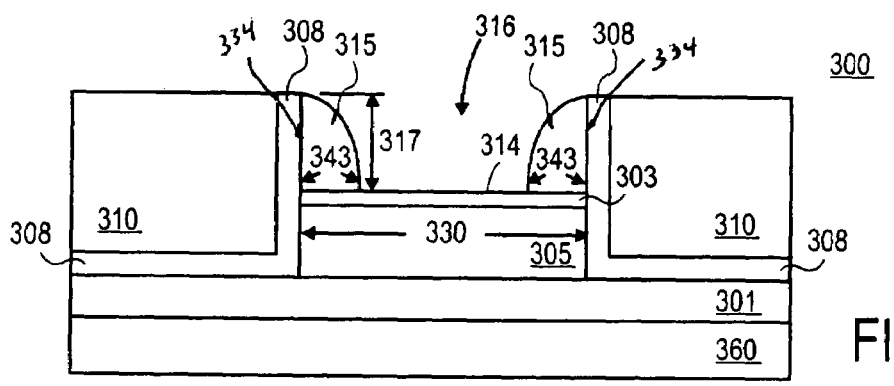
FIG. 3G is a view similar to FIG. 3F, after forming spacers on the fin.

Next, spacers 315 are formed on the fin 305. FIG. 3G is a cross-sectional view of the semiconductor structure 300 after forming spacers 315 on the fin 305. The spacers 315 are adjacent to the protection layer 308 and cover portions of the top surface 314 of the buffer layer 303 and exposed portions 334 of the protection layer 308, as shown in FIG. 3G. For one embodiment, the width 343 of each of the spacers 315 that cover the top surface 314 of the buffer layer 303 determines a width of a recess in the fin 305 formed later on in the process. For one embodiment, the spacers 315, which include silicon nitride, are formed on the buffer layer 303 of $SiO_2$ covering the exposed portions 334 of the protective layer 308 of carbon doped silicon nitride. Forming the spacers 315 on the protective layer 308 does not degrade the profile of the spacers 315. Such spacers 315 having the stable profile provide reliable control over the width of the recess and the thickness of the sidewalls of the recess formed in the fin 305 later on in the process. For an embodiment, to form spacers 315, a layer of spacer material, for example, silicon nitride is first conformably deposited to a predetermined thickness on the top surface 314 of the buffer layer 303 into the opening 316 covering the side portions of the protective layer 308. For one embodiment, the thickness of the spacer material conformably deposited on the top surface 314 of the buffer layer 303 into the opening 316 determines the width 343 of the spacers 315. Then the layer of spacer material is selectively anisotropically etched back by, for example, reactive ion etching ("RIE") technique to form the spacers 315. Processes for formation of such spacers 315 are known to one of ordinary skill in the art of transistor fabrication. For an embodiment, the width 343 of each of the spacers 315 is about one third of the width 330 of the fin 305. More specifically, if the width 330 of the fin 305 is in the approximate range of 20 nm to 120 nm, the width 343 of each of the spacers 315 may be in the approximate range of 6 nm to 40 nm.

Figure 3H:
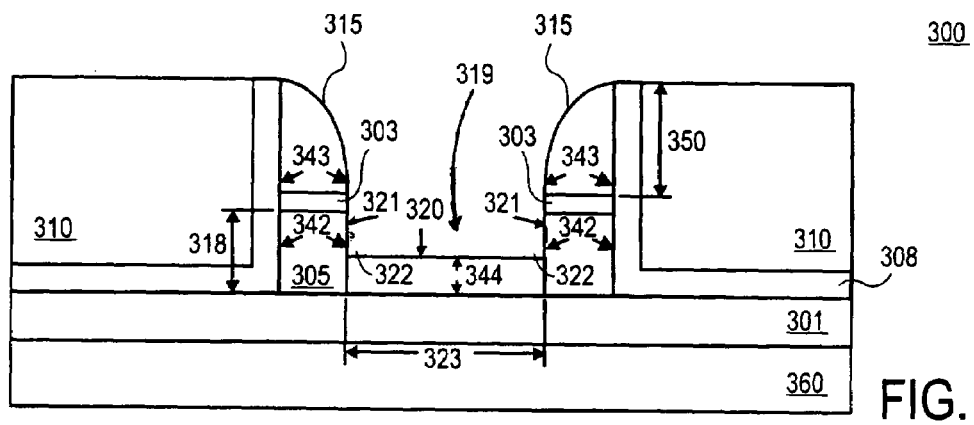
FIG. 3H is a view similar to FIG. 3G, after forming a recess in the fin.
Figure 3I:
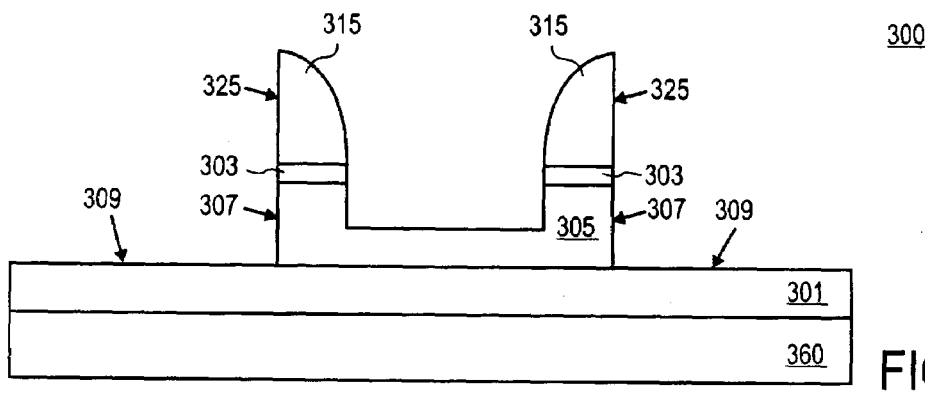
FIG. 3I is a view similar to FIG. 3H, after removing the second insulating layer and the protection layer.

FIG. 3H is a cross-sectional view of the semiconductor structure 300 after forming a recess 319 in the fin 305. The recess 319 in the fin 305 has a bottom 320 and two opposing sidewalls forming two opposing side columns 321 as shown in FIG. 3H. For an embodiment, each of two opposing side columns 321 is positioned vertically at right angle relative to the bottom 320 forming corners 322 having right angles between each of the two opposing side columns 321 and the bottom 320. The thickness 342 of each of two opposing side columns 321 of the recess 319 is controlled by the width 343 of each of the spacers 315. Because the spacers 315 are formed on the protective layer 308, the thickness and the profile of the spacers 315 are not degraded such that spacers 315 provide reliable control over the thickness 342 of each of the two opposing side columns 321 of the recess 319. For an embodiment, the thickness of the bottom 320 is controlled by the height 350 of each spacers 315, such that higher the each of the spacers 315 thinner the bottom 320 may be produced. Referring to FIG. 3G, for an embodiment, the height 317 of the spacers 315 relative to the thickness 318 of the fin 305 is in the approximate range of 1:1 to 5:1 respectively. More specifically, the height 317 of the spacers 315 is between 30 nm to 150 nm. For an embodiment, the recess 319 in the fin 305 is formed by one of techniques known to one of ordinary skill in the art of semiconductor fabrication, for example, by RIE technique. For one embodiment, the recess 319 in the fin 305 is etched from the surface of the fin 305 down to a predetermined depth to form a fully depleted transistor channel. For one embodiment, the predetermined depth of the recess 319 in the fin 305 is controlled by the etching time. For one embodiment, the recess 319 may be etched down to the predetermined depth of 300 Å to 1000 Å. For an embodiment, the predetermined depth of the recess 319 is between 0.5 to 0.8 of the thickness 318 of the fin 305 to form a fully depleted transistor channel. For one embodiment, the thickness 344 of the bottom 320 is in the approximate range of 50 Å to 150 Å. For another embodiment, the predetermined depth is equal to the width 323 of the recess to form a fully depleted transistor channel. For an embodiment, to form the fully depleted transistor channel, the thickness 344 of the bottom 320 of the recess 319 is at least two times thinner than the thickness 342 of the each of the two opposing side columns 321. More specifically, the thickness of the bottom 320 may be about 100 Å and the thickness of the each of the two opposing side columns 321 may be about 200 Å.

Next, the insulating layer 310 is selectively removed from the protection layer 308 leaving the insulating layer 301 intact, as shown in FIG. 3 I. Preservation of the insulating layer 301 while removing the insulating layer 310 is important to avoid generation of the polysilicon stringers later on in the process. The protection layer 308 is subsequently selectively removed from the fin 305, outer sidewalls 325 of the spacers 315, and the portions 309 of the insulating layer 301 at opposing sides of the fin 305, leaving the fin 305 and the insulating layer 301 intact and preserving verticality of the two opposing sidewalls 307 of the fin 305. FIG. 3I is a view similar to FIG. 3H, after removing the insulating layer 310 and the protection layer 308 from the portions 309 of the insulating layer 301 and the fin 305. For one embodiment, the insulating layer 310 of silicon dioxide may be removed from the protection layer 308 of $Si_3N_4$:C using hydrofluoric acid ("HF"), and the protection layer 308 of $Si_3N_4$:C may be removed from the fin 305 of monocrystalline silicon and from the insulating layer 301 of buried oxide by a hot phosphoric acid using a technique known in the art of the semiconductor fabrication.

Figure 3J:
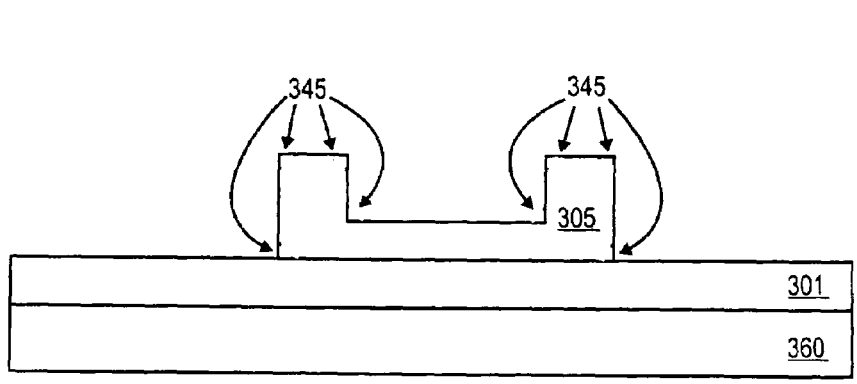
FIG. 3J is a view similar to FIG. 3I, after removing the spacers and the buffer layer from the fin.

FIG. 3J is a cross-sectional view of the semiconductor structure 300 after removing the spacers 315 and the buffer layer 303 from the fin 305 on the insulating layer 301. For an embodiment, the spacers 315 and the buffer layer 303 are subsequently removed from the fin 305 by the hot phosphoric acid and hydrofluoric acid, respectively, using a technique known to one of ordinary skill in the art of the semiconductor fabrication. The fin 305 on the insulating layer 301 has an U-shape and increased number of corners 345 relative to the Tri-gate semiconductor structure.

Figure 3K:
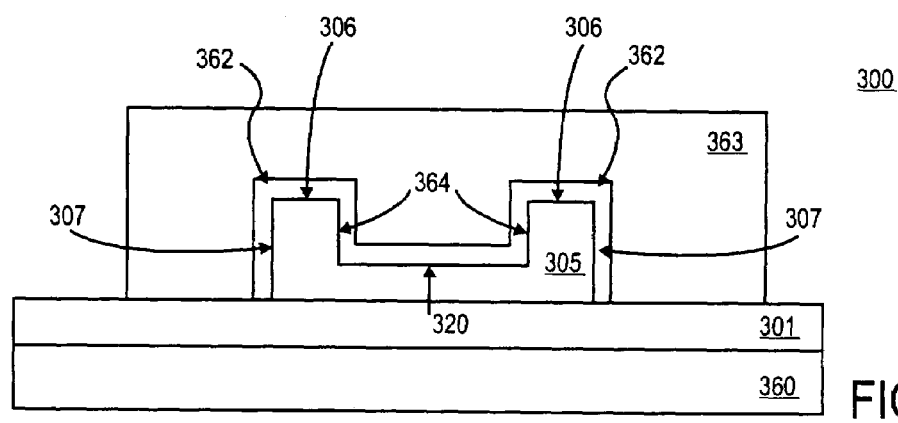
FIG. 3K is a view similar to FIG. 3J, after forming a gate dielectric layer and a gate electrode on the portion of the fin.

FIG. 3K is a cross-sectional view of the semiconductor structure 300 after subsequently forming a gate dielectric layer 362 and a gate electrode 363 on the portion of the fin 305. As shown in FIG. 3K, the gate electrode 363 with the gate dielectric layer 362 covers the top surface 306 and the two opposing sidewalls 307 of the fin 305 on the insulating layer 301 on the substrate 360, and the bottom 320 and the two opposing sidewalls 364 of the portion of the recess 319 effectively increasing the space available for electrical signals to travel. The U-shaped semiconductor transistor structure 300 also effectively doubles the number of corners under full gate control relative to the Tri-gate transistor structure that substantially reducing the non-corner component of the transistor that results in improved short-channel control.

The gate dielectric layer 362 may be formed on the fin 305 by deposition and patterning techniques, which are known to one of ordinary skill in the art of transistor fabrication. For one embodiment, the gate dielectric layer 362 may include, for example, silicon dioxide ("$SiO_2$"), silicon oxynitride ("$SiO_xN_y$"), or silicon nitride ("$Si_3N_4$"). For another embodiment, the gate dielectric layer 362 may include an oxide of a transition metal that has a dielectric constant k higher than the dielectric constant of $SiO_2$, for example, zirconium oxide ("$ZrO_2$"), hafnium oxide ("$HFO_2$"), and lanthanum oxide ("$La_2O_3$"). For an embodiment, the high-k dielectric layer may be formed on the fin 305 using an Atomic Layer Deposition ("ALD") technique. For an embodiment, the thickness of the gate dielectric layer 362 may be between 5 Å and 100 Å.

For an embodiment, the gate electrode 363 is subsequently formed on the gate dielectric layer 362 by deposition and patterning techniques, which are known to one of ordinary skill in the art of transistor fabrication. For an embodiment, the thickness of the gate electrode 363 formed on the gate dielectric layer 362 is between 500 Å and 3500 Å. For alternate embodiments, the gate electrode 363 formed on the gate dielectric layer 362 may be, but is not limited to a metal, a polysilicon, polysilicon germanium, nitride, and any combination thereof.

Next, referring to FIG. 4, a source region 403 and a drain region 404 having tip extensions (not shown) are formed at opposite sides of the fin 305. The source region 403 and the drain region 404 may be formed using one of techniques that are known to one of ordinary skill in the art of transistor fabrication. For an embodiment, the source region 403 and the drain region 404 in the fin 305 at opposing sides of the gate electrode 363 may be formed using ion implantation technique that provides ions of respective dopants into the opposite sides of the fin 305 using gate electrode 363 as a mask.

Figure 5A:
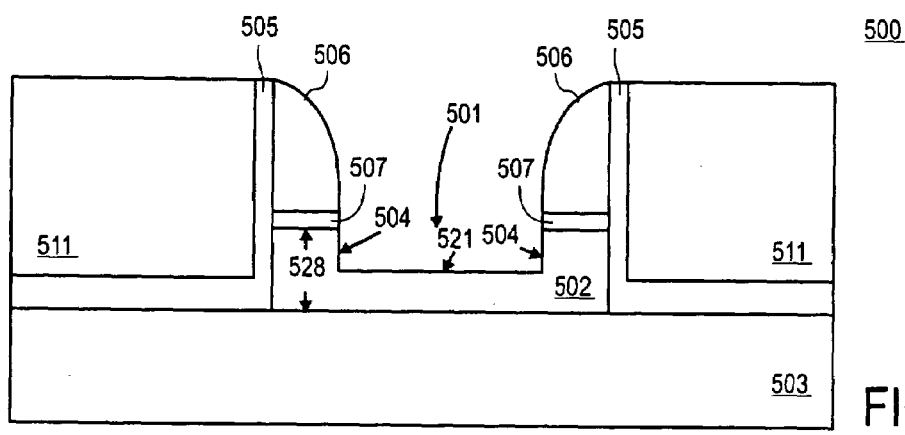
FIG. 5A illustrates a cross-sectional view of a semiconductor structure to fabricate a multi-step U-gate transistor structure according to one embodiment of the invention.

FIG. 5A illustrates a cross-sectional view of a semiconductor structure 500 to fabricate a multi-step U-gate transistor according to one embodiment of the invention. The semiconductor structure 500 is formed using a process described above with respect to FIGS. 3A–3H. As shown in FIG. 5A, the semiconductor structure 500 includes recess 501 in a fin 502 of a semiconductor material formed on an insulating layer 503. The recess 501 has a bottom 521 and two opposing sidewalls 504. Protection layer 505 covers the sidewalls of the fin 502 and the portions of the insulating layer 503 at opposite sides of the fin 502. The insulating layer 511 is formed on the portions of the protection layer 505 on opposite sides of the fin 502. The spacers 506 are formed on the top surface of the fin 502 adjacent to the protection layer 505. For an embodiment, buffer layer 507 is deposited between a top surface of the fin 502 and each of the spacers 506. For an embodiment, the recess 501 is etched down from the top surface of the fin 502 to approximately one third of the thickness 528 of the fin 502.

Figure 5B:
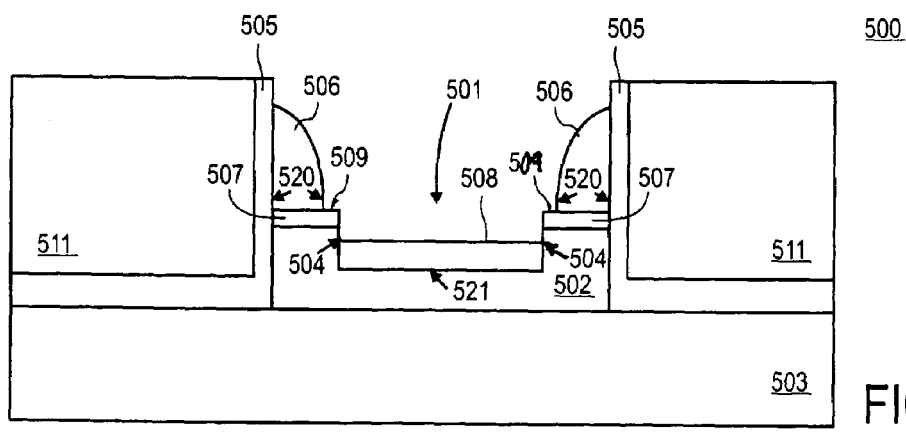
FIG. 5B is a view similar to FIG. 5A, after shrinking the spacers in size to expose portions of the top surface of the fin.

FIG. 5B is a view similar to FIG. 5A, after shrinking the spacers 506 in size down to a predetermined width to expose portions 509 of the top surface of the fin 502 covered by the buffer layer 507. For an embodiment, the spacers 506 are shrunk to a predetermined width 520, which is determined by the amount of steps to be formed subsequently. For one embodiment, the width 520 of the spacers 506 after shrinking is reduced approximately by 30%. For an embodiment, shrinking the spacers 506 is performed by etching, for example, by dry or wet etching. For one embodiment, shrinking the spacers 506 is performed by wet etching with a hot phosphoric acid. For one embodiment, the passivation layer 508, as shown in FIG. 5B, is deposited on the bottom 521 and portions of the sidewalls 504 of the recess 501 after shrinking spacers 506 to act as an etch stop layer for subsequent etching of the fin 502. For another embodiment, when dry plasma etching is used to shrink spacers 506, the passivation layer 508 is deposited on the bottom 521 and on the portions of two opposing sidewalls 504 of the recess 501 before shrinking the spacers 506, to protect the body of the fin 502 from, for example, pitting during the dry plasma etching and to act as an etch stop while forming a step in the sidewall of the recess 501 later on in the process. For one embodiment, the passivation layer 508 deposited on the bottom 521 and on the portions of the two opposing sidewalls 504 of the recess 501 formed in the fin 502 of silicon, includes an oxide. For an embodiment, the thickness of the passivation layer 508 is in the approximate range of 10 Å to 50 Å. For an embodiment, the passivation layer 508 is deposited on the bottom of the recess by one of the techniques, which are known to one of ordinary skill in the art of transistor fabrication.

Figure 5C:
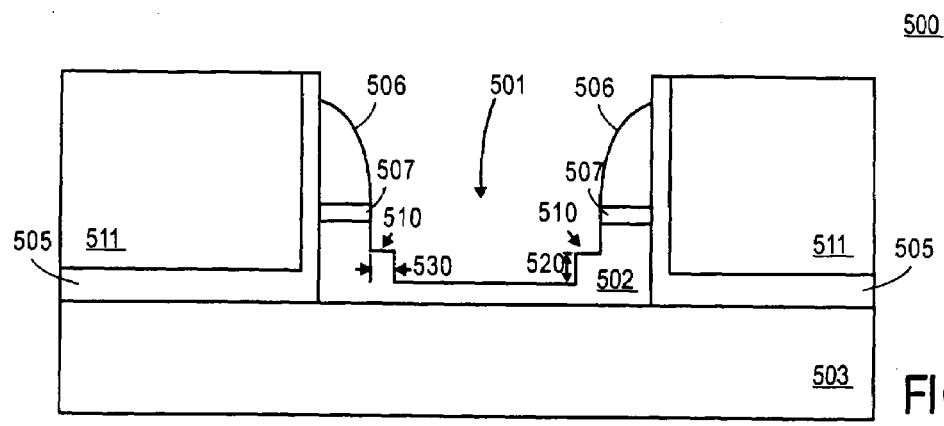
FIG. 5C is a view similar to FIG. 5B, after forming a step.

FIG. 5C is a view similar to FIG. 5B, after etching away exposed portions 509 of the top surface of the fin 502 covered by the buffer layer 507, to form steps 510 in the sidewalls of the recess 501 in the fin 502. For one embodiment, the exposed portions 509 covered by the buffer layer 507 are anisotropically etched from the top of the fin 502 down to a predetermined depth while receding sideways to a predetermined width to form each of the steps 510. For an embodiment, each of the steps 510 may have depth 520 to width 530 aspect ratio in the approximate range of 1:1 to 3:1. More specifically, each of the steps 510 has depth to width aspect ratio of about 1:1. For an embodiment, exposed portions 509 of the top surface of the fin 502 of silicon covered by the buffer layer 507 of silicon dioxide are etched away using any one of a RIE or wet etching technique, which are known to one of ordinary skill in the art of semiconductor fabrication. For one embodiment, depositing the passivation layer 508 on the bottom and portions of the sidewalls of the recess 501, shrinking the spacers 506 in size to expose portions of the top surface of the fin covered by the buffer layer, and etching away the exposed portions 509 of top surface of the fin 502 from the top of the fin down to a predetermined depth and sideways to a predetermined width is continuously repeated until a predetermined amount of steps in the sidewalls 504 of the recess 501 is produced.

Figure 5D:
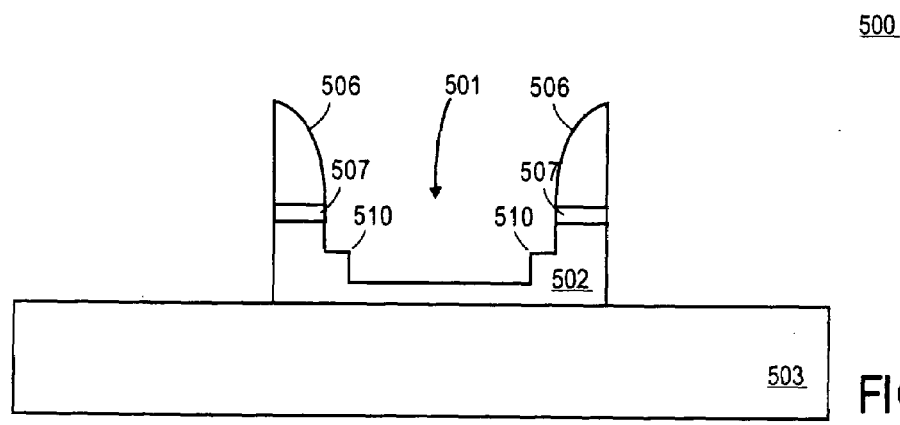
FIG. 5D is a view similar to FIG. 5C, after removing the second insulating layer and the protection layer.

FIG. 5D is a cross-sectional view of a semiconductor structure 500, after removing the passivation layer 508 from the bottom 521 and from the portions of two opposing sidewalls 504 of the recess 501, the insulating layer 510 from the protection layer 505, and the protection layer 505 from the fin 502 and portions of the insulating layer 503 on opposite sides of the fin 502. For an embodiment, removing the passivation layer of oxide from the bottom 521 and from the portions of the two opposing sidewalls 504 of the recess 501 in the fin 502 of silicon is performed by etching with, for example, hot phosphoric acid. Removing the insulating layer 511 from the protection layer 505, and the protection layer 505 from the fin 502 and portions of the insulating layer 503 on opposite sides of the fin 502 is described above with respect to FIG. 3I.

Figure 5E:
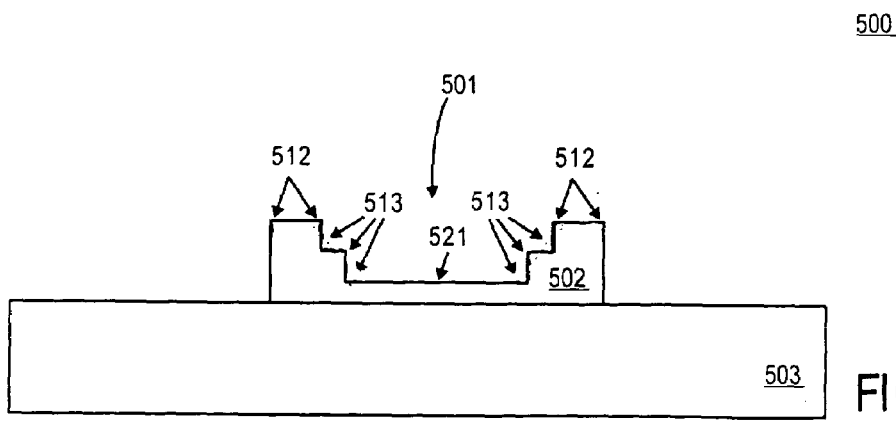
FIG. 5E is a view similar to FIG. 5D, after removing the spacers and the buffer layer from the fin.

FIG. 5E is a cross-sectional view of a semiconductor structure 500, after subsequently removing the spacers 506 and the buffer layer 507 from the fin 502, as described above with respect to FIG. 3J. As shown in FIG. 5E, the vertical sidewalls of the fin 502 form set of corners 512 with the top surface of the fin 502 and the sidewalls 504 form set of corners 513 with the bottom 521 of the recess 501 and with the steps 510, wherein the number of corners 513 exceeds the number of corners 512. The number of corners 513 may be increased by iteratively forming steps 510 in the sidewalls of the recess, as discussed above, substantially increasing the corner portion of the U-gate transistor structure relative to the non-corner portion.

Figure 6:
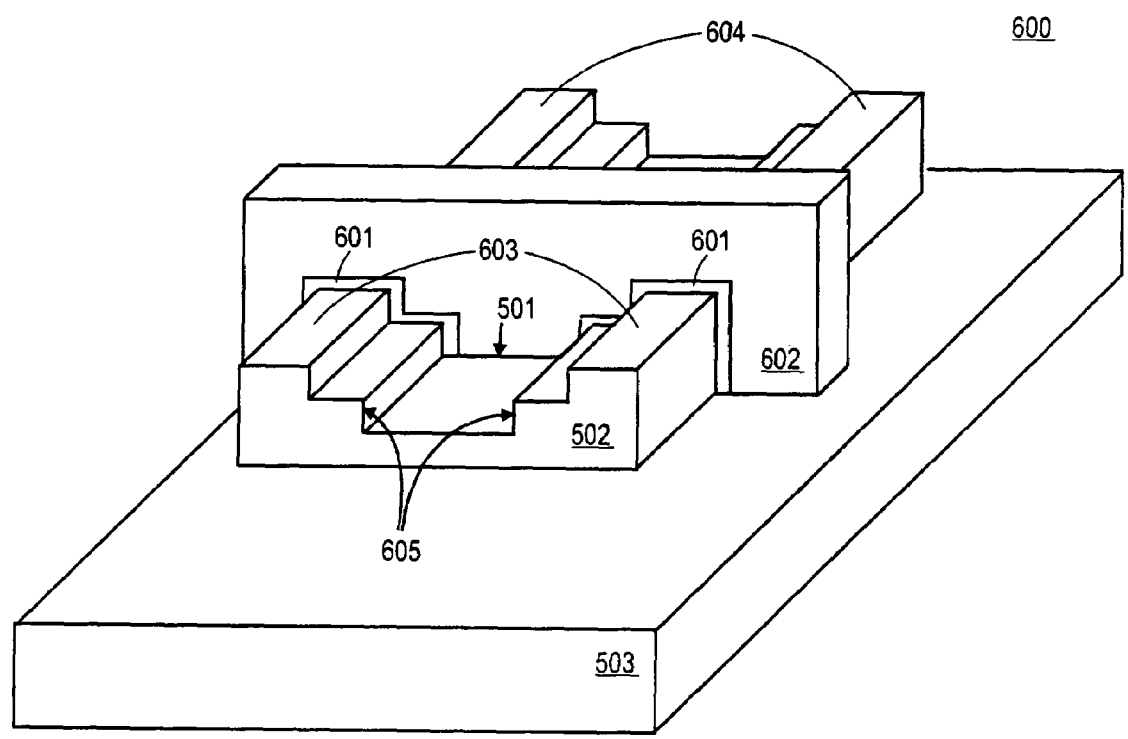
FIG. 6 is a perspective view of a multi-step U-gate semiconductor transistor structure, wherein each of sidewalls of a recess includes at least one step according to one embodiment of the invention.

FIG. 6 is a perspective view of a multi-corner U-gate semiconductor transistor structure 600, according to one embodiment of the invention. The multi-corner U-gate semiconductor transistor structure 600 includes the gate dielectric layer 601 and the gate electrode 602 subsequently formed on the portion of the fin 502 on the insulating layer 503, and the source region 603 and the drain region 604 formed at opposite sides of the fin 502, wherein each of the sidewalls of the recess 501 includes step 605. As shown in FIG. 6, the gate electrode 602 with the dielectric layer 601 covers the top surface and two opposing sidewalls of the portion of the fin 502, bottom and opposing sidewalls of the portion of the recess 501 in the fin 502, wherein each of the opposing sidewalls includes step 605. The U-shaped multi-corner semiconductor transistor structure 600 with step-like sidewalls further increases the number of corners under full gate control, thus further reducing the non-corner component of the transistor. For an embodiment, the corner portion in the I–V characteristic of the U-gate transistor structure exceeds the non-corner portion at least by 10%.

Figure 7A:
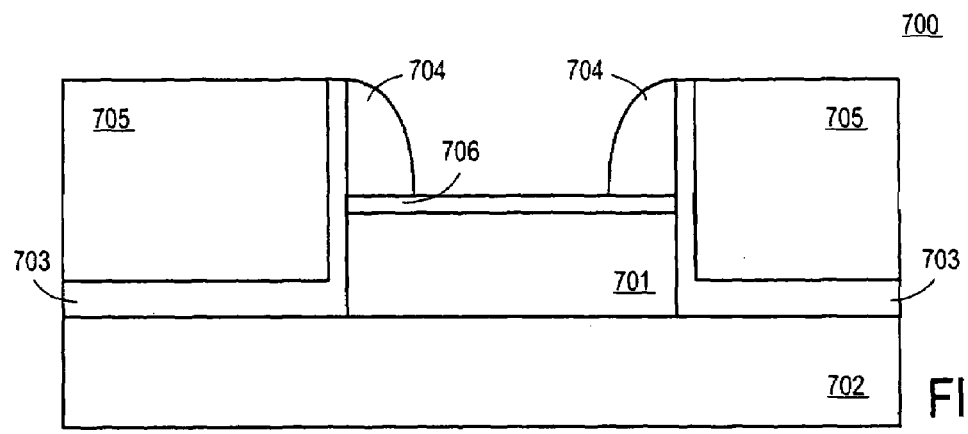
FIG. 7A illustrates a cross-sectional view of a semiconductor structure to fabricate halved fins according to one embodiment of the invention.

FIG. 7A illustrates a cross-sectional view of a semiconductor structure 700 to fabricate halved fins according to one embodiment of the invention. As shown in FIG. 7A, the semiconductor structure 700 includes a fin 701 of a semiconductor material formed on an insulating layer 702. Protection layer 703 covers the sidewalls of the fin 701 and the portions of the insulating layer 702 at opposite sides of the fin 701 and is adjacent to each of the spacers 704 that are formed on the top surface of the fin 701. The insulating 705 is formed on the portions of the protection layer 703 on opposite sides of the fin 701. For an embodiment, buffer layer 706 is deposited between a top surface of the fin 701 and each of the spacers 704. The semiconductor structure 700 is formed using a process described above with respect to FIGS. 3A–3G.

Figure 7B:
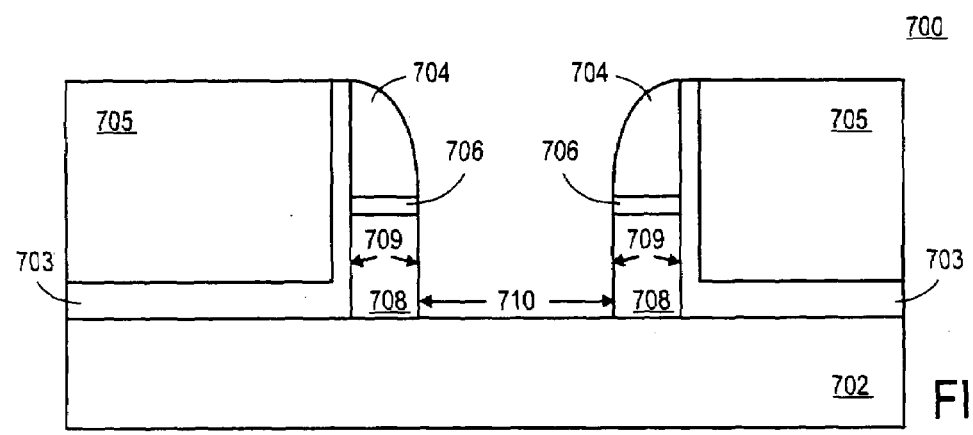
FIG. 7B is a view similar to FIG. 7A, after etching the fin from an exposed portion of the top surface down to the first insulating layer to produce two halved fins.

FIG. 7B is a cross-sectional view of a semiconductor structure 700, after etching the fin 701 from an exposed portion of the top surface of the fin 701 down to the insulating layer 702 to produce halved fins 708 doubling the amount of fins and reducing a fin pitch by a factor of two in one lithographical step. The width 709 of the halved fins 708 and the distance 710 between the halved fins 708 are controlled by the thickness of the spacers 704 and are independent on the lithographical resolution and mask features providing a robust manufacturing process. For an embodiment, each of the halved fins 708 has dimensions that are smaller than the lithographic limit. Etching the fin 701 down to the insulating layer is performed by a process described above with respect to FIG. 3H.

Figure 7C:
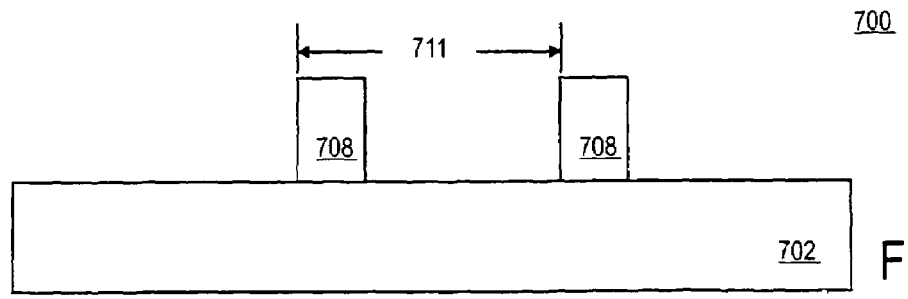
FIG. 7C is a view similar to FIG. 7B, after removing the second insulating layer, the protection layer, the spacers, and the buffer layer from the fin.

FIG. 7C is a cross-sectional view of a semiconductor structure 700, after removing the insulating layer 705, the protection layer 703, the spacers 704, and the buffer layer 706 from each of the halved fins 708 using a process described above with respect to FIGS. 3I and 3J. As shown in FIG. 7C, two halved fins 708 are formed on the insulating layer 705 from a single fin halving the pitch 711 of the fin. For an embodiment, using a process described above with respect to FIGS. 7A–7C, a plurality of halved fins having sublithographic dimensions may be fabricated out of a plurality of single fins.

Figure 8:
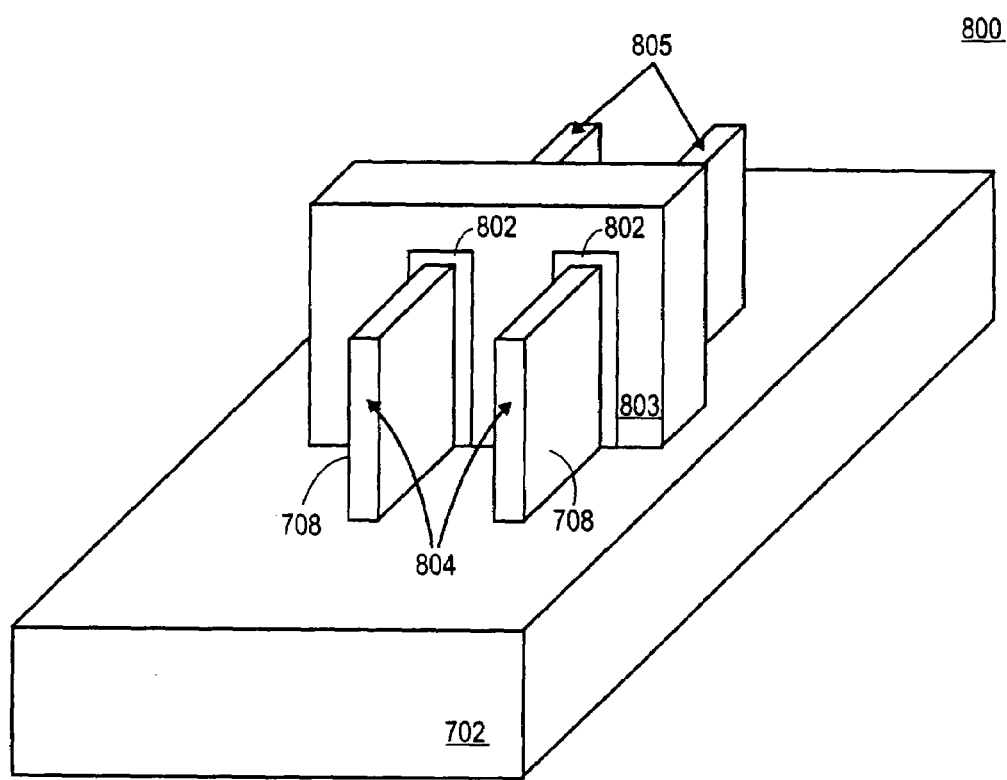
FIG. 8 is a perspective view of an U-gate semiconductor transistor structure with two halved fins having sublithographic dimensions according to one embodiment of the invention.

FIG. 8 is a perspective view of an U-gate semiconductor transistor structure 800 with two halved fins 708 on the insulating layer 702 having sublithographic dimensions according to one embodiment of the invention. The gate dielectric layer 802 and the gate electrode 803 are subsequently formed on the portion of each of the halved fins 708. The source region 804 and the drain region 805 are formed at opposite sides of the gate electrode 803 of each of the halved fins 708. As shown in FIG. 8, the gate electrode 803 with the gate dielectric layer 802 covers the top surface and two opposing sidewalls of the portion of each of the halved fins 708, producing a structure with two tri-gate transistors having a halved pitch. For an embodiment, each of the two tri-gate transistors has sublithographical dimensions.

Figure 9A:
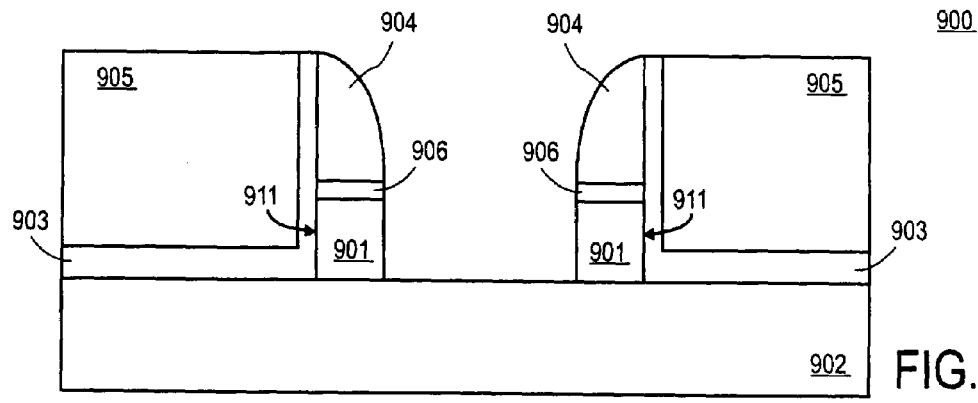
FIG. 9A illustrates a cross-sectional view of a semiconductor structure to fabricate two halved fins having sublithographic dimensions, wherein each of the halved fins includes at least one step according to one embodiment of the invention.

FIG. 9A illustrates a cross-sectional view of a semiconductor structure 900 to fabricate a transistor structure with halved fins having sublithographic dimensions, wherein each of the halved fins includes at least one step according to one embodiment of the invention. The semiconductor structure 900 includes halved fins 901 on the insulating layer 902, and the protection layer 903 covering the outer sidewalls 911 of each of the halved fins 901 and the portions of the insulating layer 902 at outer sidewalls 911 of each of the halved fins 901. The protection layer 903 is adjacent to each of the spacers 904 that are formed on the top surface of each of the halved fins 901. The insulating layer 905 is formed on the portions of the protection layer 903 at outer sidewalls 911 of each of the halved fins 901. For an embodiment, the buffer layer 906 is deposited between a top surface of each of the halved fins 901 and each of the spacers 904. The semiconductor structure 900 is formed using a process described above with respect to FIGS. 7A–7C.

Figure 9B:
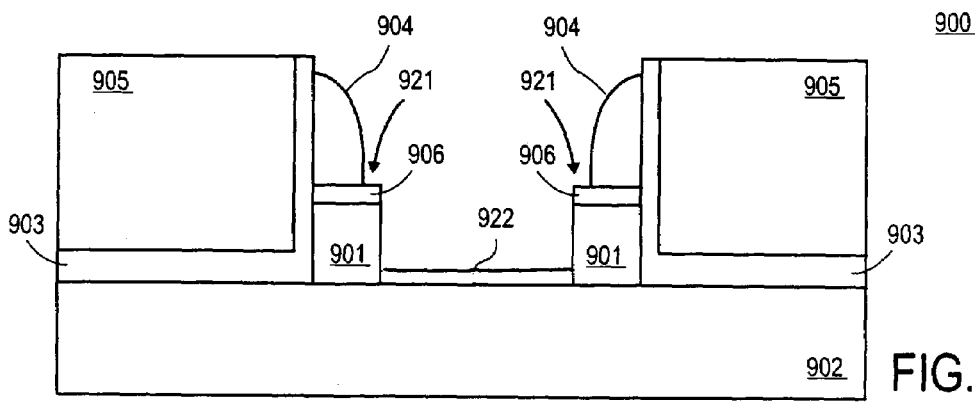
FIG. 9B is a view similar to FIG. 9A, after shrinking the spacers in size to expose portions of the top surface of each of the halved fins.

FIG. 9B is a cross-sectional view of a semiconductor structure 900, after shrinking the spacers 904 in size to expose portions 921 of the top surfaces of each of the halved fins 901 covered by the buffer layer 906. The protection layer 922 is deposited on the exposed portion of the insulating layer 902 between halved fins 901 to protect the insulating layer 902 from undercutting later on in the process. For an embodiment, the protection layer 922 deposited on the exposed portion of the insulating layer 902 of a buried oxide between halved fins 901 of silicon, is a carbon doped silicon nitride layer.

Figure 9C:
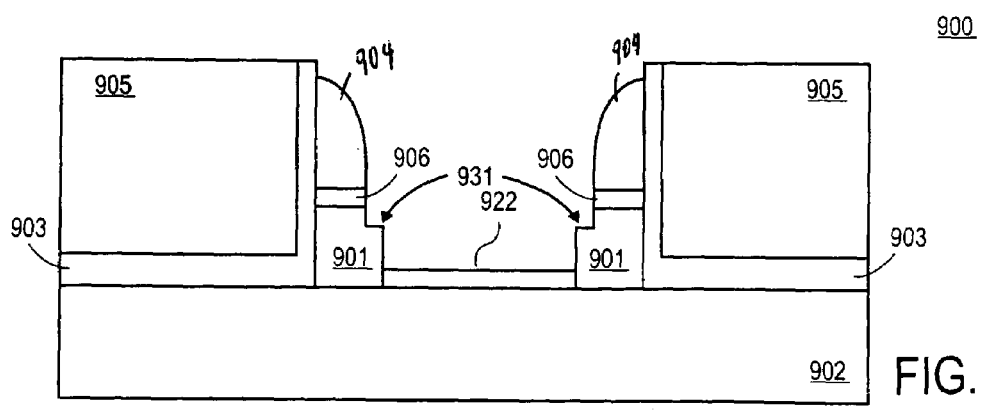
FIG. 9C is a view similar to FIG. 9B, after forming a step.

FIG. 9C is a cross-sectional view of a semiconductor structure 900, after etching away exposed portions 921 of the top surfaces of each of the halved fins 901 covered by the buffer layer 906, to form steps 931 in the internal sidewall of each of the halved fins 901 using a process described above with respect to FIG. 5C. Shrinking the spacers 904 in size is performed using a process described above with respect to FIG. 5B. For one embodiment, shrinking the spacers 904 in size is continuously repeated using a process described above with respect to FIG. 5C until a predetermined amount of steps in the sidewalls of the halved fins 901 is produced.

Figure 9D:
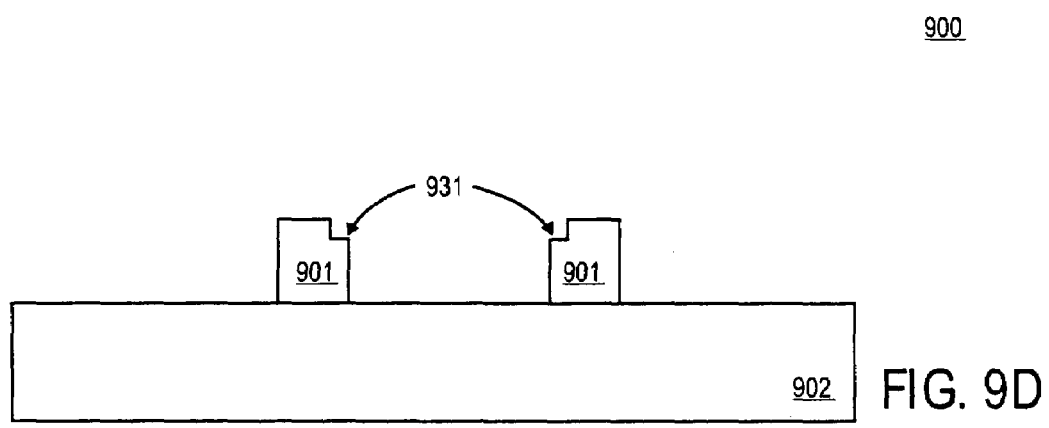
FIG. 9D is a view similar to FIG. 9C, after removing the second insulating layer, the protection layer, the spacers, and the buffer layer from the two halved fins.

FIG. 9D is a cross-sectional view of a semiconductor structure 900 after removing the insulating layer 905, the protection layer 903, the protection layer 922, the spacers 904, and the buffer layer 906 from each of the two halved fins 901 and the insulating layer 902 using a process described above with respect to FIGS. 3I and 3J. As shown in FIG. 9D, two halved fins 901 are formed on the insulating layer, wherein each of the halved fins 901 has step 931. For another embodiment, the semiconductor structure 900 may be formed by first forming recess in the fin, wherein each of the sidewalls of the recess has at least one step, as described above with respect to FIGS. 5A–5D and then forming halved fins, as described above with respect to FIG. 7B. For an embodiment, using a process described above with respect to FIGS. 7A–7C and FIGS. 5A–5D, a plurality of halved fins having at least one step and having sublithographic dimensions, may be fabricated out of a plurality of single fins.

Figure 10:
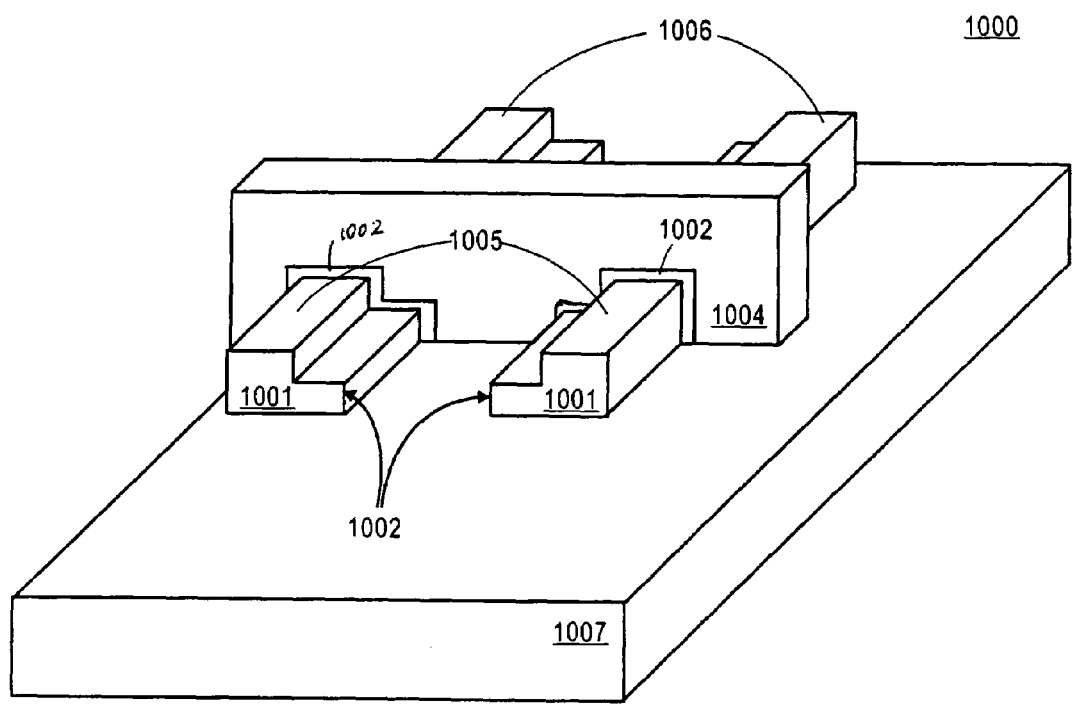
FIG. 10 is a perspective view of an U-gate semiconductor transistor structure with two halved fins having sublithographic dimensions, wherein each of the two halved fins has at least one step according to one embodiment of the invention.

FIG. 10 is a perspective view of an U-gate semiconductor transistor structure 1000 with two halved fins 1001 having sublithographic dimensions, wherein each of the two halved fins 1001 on an insulating layer 1007 has at least one step according to one embodiment of the invention. The gate dielectric layer 1003 and the gate electrode 1004 are subsequently formed on the portion of each of the two halved fins 1001 covering the step 1002. The source region 1005 and the drain region 1006 are formed at opposite sides of the gate electrode 1004 of each of the two halved fins 1001. As shown in FIG. 10, the gate electrode 1004 with the gate dielectric layer 1003 covers the top surface and two opposing sidewalls, including step 1002, of the portion of each of the two halved fins 1001, producing two multi-corner tri-gate transistor structures. For an embodiment, two multi-corner tri-gate transistor structures have halved pitch and sublithographical dimensions.

What is claimed is:

1. A method of forming a semiconductor structure, comprising:
   forming a fin of a semiconductor material on a first insulating layer, wherein a mask layer is on a top surface of the fin;
   forming a second insulating layer on the fin leaving a top surface of the mask layer exposed, wherein a protection layer is deposited between the fin and the second insulating layer;
   removing the mask layer;
   forming spacers on the top surface of the fin adjacent to the protection layer; and
   forming a recess in the fin, the recess having a bottom and opposing sidewalls.

2. The method of claim 1, wherein a buffer layer is between a top surface of the fin and the mask layer.

3. The method of claim 2, wherein the protection layer covers two opposing sidewalls of the fin, two opposing sidewalls of the mask layer, and portions of the first insulating layer on opposite sides of the fin.

4. The method of claim 3, wherein the protection layer protects the two opposing sidewalls of the fin and the portions of the first insulating layer on opposing sides of the fin from being undercut.

5. The method of claim 3, wherein forming the second insulating layer on the fin
   includes planarizing the second insulating layer such that a top surface of the second insulating layer is substantially planar with the top surface of the mask layer.

6. The method of claim 1, wherein forming the fin of the semiconductor material comprises
   depositing a layer of the semiconductor material on the first insulating layer on the substrate;
   depositing the mask layer on the layer of the semiconductor material;
   patterning and etching the mask layer on the layer of the semiconductor material; and
   etching the layer of the semiconductor material to form the fin.

7. The method of claim 1, further comprising:
   forming a gate dielectric layer covering the top surface and the opposing sidewalls of the fin and the bottom and the opposing sidewalls of the recess in the fin;
   forming a gate electrode on the gate dielectric layer; and
   forming a source region and a drain region in the fin at opposite sides of the gate electrode.

8. The method of claim 1, wherein the protection layer provides control over a thickness of the opposing sidewalls and the bottom of the recess.

9. The method of claim 1, wherein an etching rate of the protection layer is substantially lower than the etching rate of the mask layer.

10. The method of claim 9, wherein the protection layer includes carbon doped silicon nitride.

11. The method of claim 1, wherein a thickness of the mask layer determines a minimal thickness of the bottom of the recess.

12. The method of claim 1, wherein a width of each of the spacers determines a thickness of each of the opposing sidewalls of the recess.

13. The method of claim 1, wherein the bottom of the recess is thinner than each of the opposing sidewalls of the recess.

14. The method of claim 2, further comprising:
   removing the spacers;
   removing the buffer layer; and
   removing the second insulating layer, after forming the recess in the fin.

15. A method of forming a semiconductor transistor structure comprising:
   forming a fin of a semiconductor material on a first insulating layer on a substrate, the fin having a top surface, a first sidewall, and a second sidewall;
   forming a recess in the fin, the recess having a bottom and sidewalls, wherein each of the sidewalls includes at least one step;
   forming a gate dielectric layer on the top surface of the fin, on the first and the second sidewalls of the fin, on the bottom of the recess and on the sidewalls of the recess;
   forming a gate electrode on the dielectric layer; and
   forming a drain region and a source region at opposite sides of the gate electrode.

16. The method of claim 15, wherein forming a fin of a semiconductor material comprises
   depositing a layer of the semiconductor material on the first insulating layer on the substrate;
   depositing a hard mask layer on the layer of the semiconductor material, wherein a buffer layer is between the layer of the semiconductor material and the hard mask layer; and
   patterning the hard mask layer to form the fin of the semiconductor material with the buffer layer between the top surface of the fin and the hard mask layer.

17. The method of claim 15, wherein forming the recess in the fin comprises
   forming a protection layer on the hard mask layer, wherein the protection layer covers the first sidewall and the second sidewall of the fin, sidewalls of the hard mask layer, and portions of the first insulating layer at opposite sides of the fin;
   forming a second insulating layer on the protection layer leaving the top surface of the hard mask layer exposed, wherein a top surface of the second insulating layer is substantially planar with a top surface of the hard mask layer;
   removing the hard mask layer to expose the buffer layer;
   forming spacers on the buffer layer adjacent to the protection layer; and
   etching the fin from an exposed portion of the top surface of the fin down to a predetermined thickness.

18. The method of claim 17, wherein forming the second insulating layer on the protection layer comprises
   depositing the second insulating layer on the protection layer; and
   polishing the second insulating layer back to expose the top surface of the hard mask layer.

19. The method of claim 17, wherein a ratio between a height of the spacers and a thickness of the fin defines a thickness of the bottom of the recess.

20. The method of claim 15, wherein the bottom of the recess and the sidewalls of the recess are thin enough to form a fully depleted channel.

21. The method of claim 15, wherein forming the recess in the fin further comprises
   a. depositing a passivation layer on the bottom of the recess;
   b. shrinking the spacers in size to expose portions of the top surface of the fin covered by the buffer layer;
   c. etching away the exposed portions of the top surface of the fin covered by the buffer layer to form the step.

22. The method of claim 21, wherein operations a to c are continuously repeated until a predetermined amount of steps in the sidewalls of the recess is produced.

23. The method of claim 21, wherein a height of the step is equal to a width of the step.

24. A method of forming a semiconductor structure, comprising:
   forming a fin of a semiconductor material on a first insulating layer, wherein a buffer layer is deposited between a top surface of the fin and a hard mask layer;
   forming a second insulating layer on the fin leaving a top surface of the hard mask layer exposed, wherein a top surface of the second insulating layer is substantially planar with the top surface of the hard mask layer;
   removing the hard mask layer to expose the buffer layer;
   forming spacers on the buffer layer adjacent to the the second insulating layer; and
   etching the fin from the exposed portion of the top surface down to the first insulating layer to produce two halved fins.

25. The method of claim 24, wherein each of the two halved fins has sublithographic dimensions.

26. The method of claim 25, wherein a distance between the two halved fins is defined by a thickness of each of the spacers.

27. The method of claim 24, further comprising:
   forming a gate dielectric layer covering the top surface and the two opposing sidewalls of each of the two fins;
   forming a gate electrode on the gate dielectric layer; and
   forming a source region and a drain region in each of the two fins at opposite sides of the gate electrode.

28. The method of claim 24 further comprising
   forming a protection layer on the hard mask layer covering two opposing sidewalls of the fin, two opposing sidewalls of the hard mask layer, and portions of the first insulating layer on opposite sides of the fin.

29. The method of claim 24, wherein each of the two halved fins has a sidewall, which includes at least one step.

30. A method comprising:
   forming a fin of a semiconductor material on a first insulating layer;
   forming a second insulating layer on the fin leaving a top surface of the hard mask layer exposed, wherein a top surface of the second insulating layer is substantially planar with the top surface of the hard mask layer;
   removing the hard mask layer to expose the buffer layer;
   forming spacers on the buffer layer adjacent to a protection layer adjacent to the second insulating layer; and
   etching the fin from the exposed portion of the top surface down to a predetermined depth;
   depositing a passivation layer on the bottom of the recess;
   shrinking the spacers in size to expose portions of the top surface of the fin covered by the buffer layer;
   etching away the exposed portions of the top surface of the fin covered by the buffer layer to form the step.

31. The method of claim 30, wherein depositing a passivation layer, shrinking the spacers in size, and etching away the exposed portions of the top surface of the fin covered by the buffer layer are continuously repeated until a predetermined amount of steps in the sidewalls of the recess is produced.

32. The method of claim 30, wherein shrinking the spacers in size includes any one of dry etching and wet etching.

33. A semiconductor structure, comprising:
   a fin of a semiconductor material on an insulating layer, the fin having a top surface, a first sidewall, a second sidewall, and first set of corners;
   a recess in the fin, the recess having a bottom, a third sidewall, a forth sidewall, wherein the third sidewall and the forth sidewall are internal sidewalls of the recess, and second set of corners, wherein a number of the second set of corners are larger than the number of the first set of corners.

34. The semiconductor transistor structure of claim 33 further comprising:
- a gate dielectric on the top surface of the fin, on the first sidewall, the second sidewall, and on the first set of corners of the fin and on the bottom of the recess, on the third sidewall, on the forth sidewall, and on the second set of corners of the recess in the fin;
- a gate electrode formed on the gate dielectric; and
- a source region and a drain region formed on opposite sides of the gate electrode.

35. The semiconductor transistor structure of claim 33, wherein the bottom of the recess, the third sidewall and the fourth sidewall of the recess are thin enough to form a fully depleted channel.

36. The semiconductor transistor structure of claim 33, wherein the first set of corners and second set of corners include right corners.

37. The semiconductor transistor structure of claim 33, wherein each of the sidewalls of the recess in the fin includes at least one step.

* * * * *